United States Patent [19]
Houlihan et al.

[11] Patent Number: 5,843,624
[45] Date of Patent: Dec. 1, 1998

[54] ENERGY-SENSITIVE RESIST MATERIAL AND A PROCESS FOR DEVICE FABRICATION USING AN ENERGY-SENSITIVE RESIST MATERIAL

[75] Inventors: Francis Michael Houlihan, Millington; Omkaram Nalamasu, Basking Ridge; Elsa Reichmanis, Westfield, all of N.J.; Thomas Ingolf Wallow, Union City, Calif.

[73] Assignee: Lucent Technologies Inc., Murray Hill, N.J.

[21] Appl. No.: 803,703

[22] Filed: Feb. 21, 1997

Related U.S. Application Data

[60] Provisional application No. 60/013,093 Mar. 8, 1996.
[51] Int. Cl.$^6$ ..................................................... G03C 5/00
[52] U.S. Cl. ...................... 430/296; 430/325; 430/270.1; 430/913; 430/945
[58] Field of Search ................................... 430/296, 325, 430/270.1, 913, 945

[56] References Cited

U.S. PATENT DOCUMENTS

| | | | |
|---|---|---|---|
| 4,106,943 | 8/1978 | Ikeda et al. | 96/115 R |
| 4,996,136 | 2/1991 | Houlihan et al. | 430/313 |
| 5,310,619 | 5/1994 | Crivello et al. | 430/270 |
| 5,372,912 | 12/1994 | Allen et al. | 430/270 |
| 5,399,647 | 3/1995 | Nozaki et al. | 526/297 |

FOREIGN PATENT DOCUMENTS

| | | | |
|---|---|---|---|
| 43 19 178 A | of 0000 | Germany | C08F 220/42 |
| 1217453 | 8/1989 | Japan . | |

OTHER PUBLICATIONS

Abstract, Database WPI, Section Ch, Week 9350, Derwent Publications Ltd., London, GB; Class A26, AN 93–397981, XP002059114. Translation: yes. & JP 05 297 591 A (Fujitsu Ltd), Nov. 12, 1993. Translation: no.

Patent Abstracts of Japan, vol. 015, No. 352 (P–1248), Sep. 6, 1991. Translation: yes. & JP 03 134668 A (Tosoh Corp), Jun. 7, 1991. Translation: no.

Abstract, Database WPI, Section Ch, Week 9215, Derwent Publications Ltd., London, GB; Class A14, AN 92–120182, XP002059116. Translation: yes. & JP 04 063 810 A (Kuraray Co Ltd), Feb. 28, 1992. Translation: no.

T.I. Wallow et al., Evaluation of Cycloolefin–Maleic Anhydride Alternating Copolymers as Single–Layer Photoresists for 193 nm Photolithography, *Proceedings of the SPIE*, vol. 2724, Mar. 11, 1996, pp. 355–364, XP002053109.

O. Nalamasu et al., "Revolutionary and Evolutionary Resist Design Concepts for 193 nm Lithography," *Microelectronic Engineering*, vol. 1, No. 35, Feb. 1997, pp. 133–136, XP004054025.

English translation of JP 1217453/2638887.

*Primary Examiner*—Janet C. Baxter
*Assistant Examiner*—Rosemary Ashton
*Attorney, Agent, or Firm*—Richard J. Botos

[57] ABSTRACT

The present invention is directed to a process for device fabrication and resist materials that are used in the process. The resist material contains a polymer that is the polymerization product of a monomer that contains alicyclic moieties and at least one other monomer. The polymer is formed by free radical polymerization, and the resulting polymer either has alicyclic moieties incorporated into the polymer backbone or pendant to the polymer backbone via saturated hydrocarbon linkages. Other monomers are selected for polymerization with the alicyclic moiety-containing monomer on the basis of the ability of the monomer to copolymerize by free radical polymerization. Although the polymers are contemplated as useful in resist materials that are sensitive to radiation in the ultraviolet, and x-ray wavelengths as well as sensitive to electron beam radiation, the polymers are particularly advantageous for use in process in which the exposing radiation is 193 nm, because the amount of ethylenic unsaturation in these resist materials is low.

18 Claims, 1 Drawing Sheet

ENERGY-SENSITIVE RESIST MATERIAL AND A PROCESS FOR DEVICE FABRICATION USING AN ENERGY-SENSITIVE RESIST MATERIAL

CLAIM OF PRIORITY

This application claims priority of Provisional Application Ser. No. 60/013,093 filed Mar. 8, 1996.

BACKGROUND OF THE INVENTION

1. Technical Field

The invention is directed to an energy sensitive material and a process for device fabrication in which the energy sensitive resist material is used.

2. Art Bcackground

Devices such as integrated circuits are complex structures made of a variety of materials. These materials are precisely configured to form the desired device by a variety of processes. A lithographic process is frequently used to transfer the desired configuration into a substrate to fabricate such devices.

Lithographic processes use intermediate materials frequently referred to as resists. A positive or negative image of the desired configuration is first introduced into the resist by exposing it to patterned radiation which induces a chemical change in the exposed portions of the resist. This chemical change is then exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, solution-developed resists are designed to have absorption characteristics appropriate for use at certain exposure wavelengths. It is axiomatic that, if the resist material is opaque to the exposing radiation, the exposing radiation will not be transmitted into the resist material and the desired chemical change will not occur. Therefore it is important to select a resist material that has the appropriate light transmission characteristics at the wavelength of the exposing radiation. Other considerations that drive the selection of an appropriate resist material include the etch resistance of the resist after it has been exposed and developed.

In this regard, resist materials that contain polymers with ethylenic and/or aromatic unsaturation are typically used in lithographic processes for device fabrication in which the wavelength of the exposing radiation is in the traditional ultraviolet (UV) or deep UV range (i.e., about 240 nm to about 370 nm). However, these resist materials are often not suitable in processes in which the exposing radiation is 193 nm because the carbon-carbon double bond absorbs radiation at this wavelength. Consequently, resist materials that are being used for lithographic processes in which the exposing radiation has a wavelength of 248 nm or more are generally not useful in processes that use exposing radiation with a wavelength of 193 nm. Since lithographic processes for fabricating devices using 0.18 µm and 0.13 µm design rules are likely to use 193 nm-wavelength light as the exposing radiation, resist polymers that do not contain significant amounts of ethylenic unsaturation are sought.

One type of resist material that has been suggested as suitable for 193 nm lithographic processes contains a derivatized acrylate or methacrylate copolymer. While resist materials that contain these copolymers demonstrate adequate sensitivity to 193 nm wavelength radiation, the plasma etch resistance of these copolymers does not meet current processing requirements. Therefore, resist materials that are compatible with 193 nm lithographic processes are desired.

SUMMARY OF THE INVENTION

The present invention is directed to a lithographic process for device fabrication which utilizes an energy sensitive resist material that contains a polymer with saturated alicyclic moieties incorporated either in the polymer backbone or attached to the polymer backbone via saturated hydrocarbon linkages. It is advantageous if about 25 mole percent to about 50 mole percent of the polymer constitutes monomers that contain these alicyclic moieties. For convenience herein, the polymer is described in terms of the individual molecules (i.e., monomers) that are polymerized to form the polymer. The alicyclic moiety is advantageous because the polymers with alicyclic moieties therein have an advantageous resistance to plasma etching that is useful in processes for device fabrication.

The polymer is a copolymer of an alicyclic moiety-containing monomer (alicyclic monomer hereinafter) and at least one other monomer. The alicyclic moiety in the monomer is one or more hydrocarbon rings with one or more ethylenically unsaturated bonds. The ethylenic functionality of the monomer is either contained in the hydrocarbon ring or pendant to the hydrocarbon ring. The alicyclic monomer is either substituted or unsubstituted. Examples of suitable substituent groups include alkyl groups, carbonyl groups, carboxylate groups, hydroxyl groups and nitrile groups. These groups are offered by way of example only. Substituent groups that do not absorb radiation at the wavelength of the exposing radiation are contemplated as suitable. Examples of suitable alicyclic monomers are cycloolefins such as norbornene, and cyclodiolefins such as 1,5-cyclooctadiene, 1,5-dimethyl-1,5-cyclooctadiene, and 5,6-dihydrodicyclopentadiene.

The second monomer is one that copolymerizes with the alicyclic monomer via a free radical polymerization. It is advantageous if the second monomer undergoes free-radical polymerization with the first monomer in a manner that incorporates the alicyclic moiety in the polymer backbone. Examples of suitable monomers include maleimide monomers, and maleic anhydride monomers. Other monomers such as acrylate monomers, fumarate monomers, and acrylonitrile monomers are also contemplated as suitable if polymerization takes place in the presence of a lewis acid. In the embodiment of the invention in which the exposing radiation has a wavelength of 193 nm, it is advantageous if the monomer is selected so that the resulting polymer contains a lithographically insignificant amount of ethylenic unsaturation or other functionality with an absorbance that is too high at the wavelength of the exposing radiation. In the context of the present invention, "lithographically insignificant" means that the amount is not sufficient to cause adverse lithographic consequences. Maleic anhydride is an example of a monomer that is suitable for copolymerization with the alicyclic moiety to provide a polymer that is useful in lithographic processes in which the exposure wavelength is 193 nm.

Since the above-described polymers are the result of free-radical alternating copolymerization, which is a one-to-one type of polymerization, the resulting copolymers are about 50 mole percent of the alicyclic monomer and about 50 mole percent of the second monomer. For example, if the polymer is the polymerization product of norbornene and maleic anhydride, the resulting polymer has the following general structure:

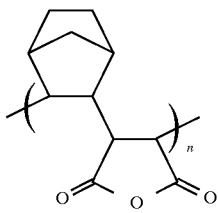

It is advantageous if the polymer is the polymerization product of the two monomers specified above and at least one other monomer. The other monomer or monomers are chosen to further enhance the performance of the resist materials in lithographic processes for device fabrication. In this regard, factors such as aqueous base solubility, adhesion promotion, and the absorbance of the other monomers at the wavelength of the exposing radiation are considered in making the selection. Other factors such as the glass transition temperature of the resulting polymer are also considered in selecting additional monomers. One skilled in the art will appreciate the various factors in considering the monomers from which to form polymers which are suitable for use in the process of the present invention. Suitable additional monomer or monomers do not hinder the free radical polymerization of the first and second monomer. Specifically, the other monomer or monomers are selected so that the resulting polymer contains about five mole percent to about 50 mole percent of these other monomers. Preferably the resulting polymer contains about five mole percent to about 45 mole percent of these monomers. Examples of these monomers include acrylic acid, methacrylic acid, and substituted or unsubstituted acrylates and methacrylates.

It is also contemplated that the resist materials may be the polymerization product of more than three monomers. If more than three monomers are used, the fourth, fifth, etc. monomers are selected using the guidelines set forth above for the selection of additional monomers. In one example, the polymer is the polymerization product of four monomers: the monomer with the alicyclic moiety, maleic anhydride, the acrylic or methacrylic acid, and the substituted or unsubstituted acrylate or methacrylate. Although there are two additional monomers in the polymer of this embodiment, the polymer contains about five mole percent to about 50 mole percent of these additional monomers in total.

Resist materials are formed by combining the above-described polymers with other materials. In one embodiment of the present invention, the polymer has, to some fraction of its monomer units, acid labile groups pendant thereto which render the polymer less soluble in a solution of aqueous base than it otherwise would be without such groups pendant thereto. In this embodiment, the polymer is combined with a material that generates an acid when exposed to radiation (frequently referred to as photoacid generators (PAG)) to form the resist material. In another embodiment, the resist material is formed by combining the polymer which is relatively soluble in an aqueous base solution, a dissolution inhibitor, and a PAG. In yet another embodiment, the resist material is formed by combining the polymer which is relatively insoluble in aqueous base solution, in combination with a dissolution inhibitor and a PAG. In all embodiments, the PAG generates photoacid when the resist is irradiated. The photoacid so generated, typically in conjunction with the application of heat (referred to as a post-exposure bake), promotes a chemical change that increases the aqueous base solubility of the irradiated resist.

In the embodiment wherein the resist material contains the relatively insoluble polymer in combination with a PAG, it is advantageous if the polymer is a copolymer of the alicyclic monomer, the second monomer as previously described, and at least one other monomer such as acrylic acid, methacrylic acid, and acrylates and methacrylates substituted with suitable groups including, but not limited to, acid labile groups. This embodiment requires that an acid labile group be pendant to the polymer to provide the polymer with the desired degree of insolubility in aqueous base before irradiation. Upon irradiation and post-exposure bake, a sufficient portion of these acid labile groups are cleaved to render the polymer soluble in aqueous base. Therefore, if the acid labile group is not pendant to the acrylate or methacrylate monomers, it must be pendant to some other monomer used to form the polymer, preferably the alicyclic monomer.

The monomers described above are advantageous because they do not interfere with the more favored free radical polymerization of the alicyclic monomer (e.g. norbornene) and the second monomer (e.g. maleic anhydride). One example of a suitable copolymer is the polymerization product of a norbornene monomer, a maleic anhydride monomer, and an acrylate or a methacrylate monomer. One example of the above-described polymer is represented by the following structure:

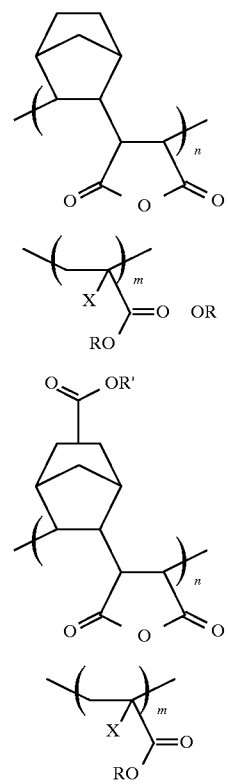

wherein n=about 0.95 to about 0.5, m=about 0.05 to about 0.5, and n+m=1. Embodiments wherein n=about 0.95 to about 0.75 and m=about 0.05 to about 0.25 are viewed to be advantageous. It is advantageous if n=0.85 to about 0.8 and m=about 0.15 to about 0.2. X is either hydrogen or methyl.

For the above polymer to be inherently insoluble in aqueous base, either R, R' or both are substituent groups that provide the polymer with the desired insolubility. If one of either R of R' is a substituent that provides the polymer with the desired degree of insolubility, then the other of R or R' can be hydrogen. If R is the substituent intended to render the polymer insoluble in aqueous base solution, then R is an acid labile group. If R' is the substituent intended to render the polymer insoluble in aqueous base solution, then R' is an acid labile group. Examples of suitable acid labile groups include t-butyl, t-amyl, 1-methylcyclohexyl, 3-oxocyclohexyl, and bis(2-trimethylsilyl)ethyl, and other substituents that easily undergo cleavage of the acid labile group in the presence of the photoacid. In the presence of acid, these groups produce a free carboxylic acid and an acidolysis or acid-catalyzed hydrolysis byproduct.

As noted above, the PAG generates an acid (the "photoacid" hereinafter) when the resist material is exposed to radiation. In this embodiment, the resist material is about 0.5 weight percent to about 20 weight percent (based on the weight of the resist material excluding solvent) PAG combined with the above-identified terpolymer. If the PAG content is above about 15 weight percent of the resist material, the optical density of the resist material may be too high and its presence above this concentration may hinder development.

In the embodiment wherein the resist material is used in a lithographic process in which the wavelength of the exposing radiation has a wavelength of about 193 nm, the amount of PAG depends upon the composition of the PAG. If the PAG contains an aromatic moiety, it is advantageous if the amount of PAG in the resist material is about 0.5 to about 4 weight percent, because the aromatic unsaturation in these moieties absorbs radiation at this wavelength. In other embodiments wherein radiation of a different wavelength is used, or where a PAG which does not absorb a lithographically significant amount of the exposing radiation is used, more PAG, about 1 weight percent to about 20 weight percent, is incorporated into the resist material.

The photoacid cleaves the acid labile groups from the polymer, typically during a post-exposure bake. The cleavage of these groups from the polymer causes the exposed resist material to be more soluble than the unexposed resist material in aqueous base solution. An aqueous base developer solution is then used to dissolve and remove the exposed resist material. The unexposed resist material is then used as a patterned mask for subsequent processing of the underlying substrate; typically for pattern transfer into the substrate.

In the embodiment of the present invention wherein the resist material contains a copolymer that is inherently soluble in aqueous base, a dissolution inhibitor, and a PAG, the polymer does not have acid labile groups pendant thereto. In this embodiment it is advantageous if the polymer is a copolymer of a cycloolefin such as substituted or unsubstituted norbornene, maleic anhydride, and at least one other monomer. If the cycloolefin is unsubstituted, then at least one of the other monomers should contain a free carboxylic acid. Acrylic acid and methacrylic acid are examples of suitable monomers. If the cycloolefin is substituted with an acidic functionality such as a carboxylic acid group, the other monomers are not required to contain a free carboxylic acid functionality. In this embodiment, the dissolution inhibitor changes from relatively insoluble to relatively soluble when exposed to the photoacid and heat.

In a third embodiment of the present invention, the resist materials contain the polymer that is inherently insoluble in aqueous base in combination with a dissolution inhibitor and a PAG. In this embodiment, the contrast between the portion of the resist material that is exposed to radiation and the unexposed portion is enhanced because the aqueous base solubility of both the polymer and the dissolution inhibitor is altered by the acid generated by the PAG when the resist material is exposed to radiation and post-exposure baked.

In the process of the present invention, generally, the resist material containing the components described generally above, is formed into a film on the surface of a substrate that is typically a silicon wafer. The silicon wafer will typically have layers of other materials formed thereon. These wafers, with or without layers of other materials formed thereon, are referred to herein as substrates.

The resist-coated substrate is then subjected to a pattern-wise exposure to radiation to delineate the image of a pattern into the energy-sensitive resist material a chemical agent, the photoacid generated in the course of the irradiation, effects a chemical change (typically upon heating), which enhances the aqueous base solubility of the irradiated portion of the resist. The resist materials of the present invention are contemplated as useful in lithographic processes in which the exposing radiation is either ultraviolet radiation with a wavelength of about 190 nm to about 370 nm, x-ray radiation, or electron beam radiation.

After the image of the pattern is delineated in the resist material, the image is developed into a pattern by exploiting the difference in aqueous base solubility between the exposed resist material and the unexposed resist material. In the context of the present invention, the term "exposed resist material" implies the portion of the resist whose aqueous base solubility has been increased by exposure to the photoacid and, typically, heat.

After the development, the pattern in the resist is transferred into the underlying substrate using conventional etching expedients well known to one skilled in the art.

DETAILED DESCRIPTION

Figure 1:
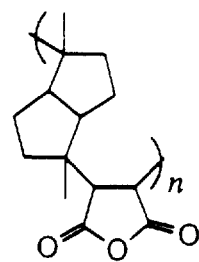
FIG. 1 illustrates a copolymer of 1,5-Dimethyl-1,5-cyclooctadiene and maleic anhydride.

The present invention is directed to a class of energy-sensitive resist materials that are useful in lithographic processes for device fabrication. Processes for device fabrication which include lithographic steps have been described in treatises such as S. M. Sze, *VLSI Technology*, (McGraw-Hill pub., 1983) and L. F. Thompson et al., *Introduction to Microlithography*, pp. 87–161 (American Chemical Society Symposium Series 219, 1983) which are hereby incorporated by reference. Lithographic steps typically include exposing and patterning energy definable materials such as resist materials. An image is first introduced into the resist and developed to form a pattern, which is then transferred into the substrate.

The materials are energy-sensitive; i.e., energy induces a chemical change in these materials. When these materials are exposed to either patterned radiation of the appropriate wavelength, e.g., UV light with a wavelength of about 190 nm to about 370 nm, x-ray radiation or particle beams such as electron beams in direct-write lithographic processes, the chemical change is induced to a significantly greater extent in the portion of the resist material that is directly exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into an underlying substrate.

Aqueous base solutions are typically used to develop patterns in energy sensitive resist materials. One common example of an aqueous base solution is an aqueous solution of tetramethylammonium-hydroxide (TMAH) that is about 0.05M to about 0.5M, although many other solutions are well known to one skilled in the art.

In the positive-tone resist materials of the present invention, the material that is not exposed to radiation is relatively insoluble in the aqueous base developer solution relative to the material that is exposed to radiation. This difference in aqueous base solubility is effected either by manipulating the aqueous base solubility of the polymer in the energy sensitive material, or by manipulating the aqueous base solubility of a dissolution inhibitor in the energy-sensitive resist material.

The energy-sensitive resist materials of the present invention contain a polymer with an alicyclic moiety that is either incorporated into the polymer backbone or pendant to the polymer backbone via saturated hydrocarbon linkages. In the context of the present invention, the polymer is described in terms of the molecules, known as monomers, which undergo polymerization to form the polymer. Generally, if polymers are formed from monomers that all have the same chemical structure and composition, they are referred to as homopolymers. Polymers that are formed from two or more chemically distinct types of monomers, e.g. acrylic acid and maleic anhydride, are referred to herein as a copolymer.

It is advantageous if the copolymers of the present invention contain about twenty-five mole percent to about fifty mole percent of the monomers with the alicyclic moiety. This monomer can be substituted or unsubstituted as previously described. In one embodiment of the present invention, the polymer is a copolymer of the alicyclic monomer and at least one other monomer. The second monomer is selected for its ability to copolymerize with the alicyclic monomer via a free radical polymerization. It is advantageous if the second monomer undergoes free-radical polymerization with the first monomer in a manner that incorporates the alicyclic moiety in the polymer backbone.

Whether a particular monomer will undergo the desired polymerization with the alicyclic-moiety containing monomer depends upon the reactivity ratios of the monomers and the relative amount of the monomers in the feed composition for the polymerization. These relationships are discussed generally in *Polymer Handbook*, chap. II.5 (Brandrup, J. et al. eds., 2nd ed., 1989). In order to achieve a polymer with roughly equal amounts of the alicyclic monomer and the second monomer, the rate constants of the polymerization must be such that, whenever the first (i.e., the alicyclic monomer) has been incorporated on the polymer chain, the resulting active end group will discriminate highly in favor of incorporating the second monomer compared to the first, and vice-versa. Such a result is obtained when the rate constant for adding a first monomer is low when the growing polymer chain terminates in the first monomer but is high when the growing polymer chain terminates in the second monomer and when this same relationship holds for the second monomer. The ratio of these rate constants is referred to as the reactivity ratio. Since the desired result is obtained when the second rate constant is much higher than the first, reactivity ratios that approach zero are advantageous. Consequently, the second monomers that are contemplated as suitable for use in the polymers of the present invention possess reactivity ratios with the alicyclic monomer that approach zero, and, with which the alicyclic monomers possess reactivity ratios that approach zero.

Examples of suitable second monomers include maleimide monomers, and maleic anhydride monomers. Other monomers such as acrylate monomers, fumarate monomers, and acrylonitrile monomers are also contemplated as suitable if the polymerization takes place in the presence of a lewis acid. In the embodiment of the invention in which the exposing radiation has a wavelength of 193 nm, it is advantageous if the monomer is selected so that the resulting polymer contains a lithographically insignificant amount of ethylenic unsaturation or other functionality with an absorbance that is too high at the wavelength of the exposing radiation. In the context of the present invention, "lithographically insignificant" means that the amount is not sufficient to cause adverse lithographic consequences. Maleic anhydride is an example of a monomer that is suitable for copolymerization with the alicyclic moiety to provide a polymer that is useful in lithographic processes in which the exposure wavelength is 193 nm.

It is advantageous if the polymer is the polymerization product of the two monomers specified above and at least one other monomer. The other monomer or monomers are chosen to further enhance the performance of the resist materials in lithographic processes for device fabrication. In this regard, factors such as aqueous base solubility, adhesion promotion, and the absorbance of the other monomers at the wavelength of the exposing radiation are considered in making the selection. Other factors such as the glass transition temperature of the resulting polymer are also considered in selecting additional monomers. One skilled in the art will appreciate the various factors in considering the monomers from which to form polymers which are suitable for use in the process of the present invention. Suitable additional monomer or monomers do not hinder the free radical polymerization of the first and second monomer. Specifically the other monomer or monomers are selected so that the resulting polymer contains about five mole percent to about fifty mole percent of these other monomers. Preferably the resulting polymer contains about five mole percent to about forty-five mole percent of these monomers. Examples of suitable third monomers include acrylic acid, methacrylic acid, acrylates and methacrylates. These monomers are either substituted or unsubstituted. As described below, these substituents, if present, can be used to provide the polymer with advantageous properties. Since the glass transition temperature ($T_g$) of the alternating copolymer is high (i.e. on the order of about 300° C.) the acrylic acid and acrylate monomers are advantageous because the $T_g$ of the polymer is lower when these monomers are incorporated therein.

It is also contemplated that the resist materials may be the polymerization product of more than three monomers. If more than three monomers are used, the fourth, fifth, etc. monomers are selected using the guidelines set forth above for the selection of additional monomers. In one example, the polymer is the polymerization product of four monomers: the monomer with the alicyclic moiety, maleic anhydride, acrylic acid or methacrylic acid, and a substituted or unsubstituted acrylate or methacrylate. Although there are two additional monomers in the polymer of this embodiment, the polymer contains about five mole percent to about fifty mole percent of these additional monomers in total.

Resist materials are formed by combining the above-described polymers with other materials. In one embodiment of the present invention, the polymer has, to some fraction of its monomer units, acid labile groups pendant thereto which render the polymer less soluble in an aqueous base solution than it otherwise would be without such groups pendant thereto. In this embodiment, the polymer is combined with a photoacid generator (PAG) to form the resist material. In another embodiment, the resist material contains the polymer which is relatively soluble in an aqueous base solution, a dissolution inhibitor, and a PAG. In yet another embodiment, the resist material contains the polymer which is relatively insoluble in aqueous base solution, in combination with a dissolution inhibitor and a PAG.

In the above-described embodiments, the solubility of the resist composition in aqueous base solution is altered when the resist material is exposed to radiation. Since the resist materials of the present invention are positive resists, the aqueous base solubility of the exposed resist is greater than the aqueous base solubility of the resist that is not exposed to radiation. If the ratio of the rate of dissolution of the resist before irradiation compared to that after irradiation is taken as 1:n, n should be not be less than 2. Relative solubility ratios with values of n less than 2 typically produce low contrast and inferior image quality.

In the embodiments of the present invention wherein the polymer is inherently insoluble in aqueous base, the polymer has acid labile or free acid moieties pendant thereto which render the polymer insoluble. When the resist material is exposed to radiation, the photoacid generated by the PAG, typically in combination with a post-exposure base, removes a sufficient amount of these acid labile to render the polymer soluble in aqueous base solution.

In the embodiment wherein the resist material contains the relatively insoluble polymer in combination with a PAG, it is advantageous if the polymer is a copolymer of the alicyclic monomer, the second monomer as previously described, and at least one other monomer such as the previously described acrylic acid, methacrylic acid, acrylates and methacrylates. This is because these monomers do not interfere with the more favored free radical polymerization of the alicyclic monomer and the second monomer. One example of a suitable copolymer is the polymerization product of a norbornene monomer, a maleic anhydride monomer, and an acrylate monomer with a suitable acid labile group. An example of the polymer is represented by the following structure:

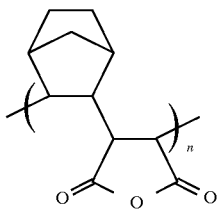

-continued

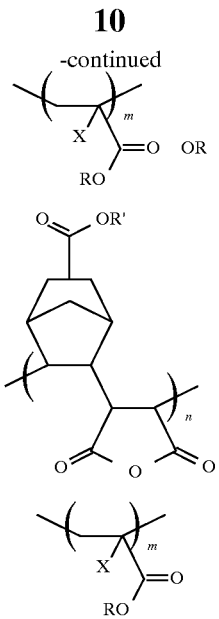

wherein n=about 0.95 to about 0.5, m=about 0.05 to about 0.5, and n+m=1. Embodiments wherein n=about 0.95 to about 0.75 and m=about 0.05 to about 0.25 are viewed to be advantageous. It is advantageous if n=0.85 to about 0.8 and m=about 0.15 to about 0.2.

For the above polymer to be inherently insoluble in aqueous base, either R, R' or both are substituent groups that provide the polymer with the desired insolubility. If one of either R of R' is a substituent that provides the polymer with the desired degree of insolubility, then the other of R or R' can be hydrogen. If R is the substituent intended to render the polymer insoluble in aqueous base solution, then R is an acid labile group. If R' is the substituent intended to render the polymer insoluble in aqueous base solution, then R' is an acid labile group. Examples of suitable acid labile groups include t-butyl, t-amyl, 1-methylcyclohexyl, 3-oxocyclohexyl, and bis (2-trimethylsilyl)ethyl, and other substituents that easily undergo cleavage of the acid labile group in the presence of acid. In the presence of the photoacid, these groups produce a free carboxylic acid and an acidolysis or acid-catalyzed hydrolysis byproduct. In one embodiment, R' is H and R is one of the acid labile groups specified above.

As noted above, the PAG generates an acid when the resist material is exposed to radiation. In this embodiment, the resist material is about 0.5 weight percent to about 20 weight percent PAG combined with the above-identified terpolymer. If the PAG content is above about 20 weight percent of the resist material, the optical density of the resist material may be too high and its presence above this concentration may hinder development.

In the embodiment wherein the resist material is used in a lithographic process in which the wavelength of the exposing radiation has a wavelength of about 193 nm, the amount of PAG depends upon the composition of the PAG. If the PAG contains an aromatic moiety, it is advantageous if the amount of PAG in the resist material is about 0.5 to about 4 weight percent, because the ethylenic unsaturation in these moieties absorbs radiation at this wavelength. In other embodiments wherein radiation of a different wavelength is used, more PAG, about 1 weight percent to about 20 weight percent, is incorporated into the resist material.

The photoacid cleaves the acid labile groups or free acid groups from the polymer, typically during a post-exposure bake. The cleavage of these acid labile groups from the polymer causes the exposed resist material to be more soluble than the unexposed resist material in aqueous base solution. An aqueous base developer solution is then used to dissolve and remove the exposed resist material. The unexposed resist material is then used as a patterned mask for subsequent processing of the underlying substrate; typically for pattern transfer into the substrate.

In the embodiment of the present invention wherein the resist material contains a copolymer that is inherently soluble in aqueous base, a dissolution inhibitor, and a PAG, the polymer does not have acid labile groups pendant thereto. In this embodiment it is advantageous if the polymer is a copolymer of a cycloolefin such as substituted or unsubstituted norbornene, maleic anhydride, and at least one other monomer. As previously stated, the polymer in this embodiment must have a free acid functionality. The free acid functionality can be provided by either the cycloolefin monomer, the other monomer(s), or a combination thereof. If the free acid functionality is present on the norbornene monomer, copolymers of norbornene and a second monomer are contemplated as suitable. The other monomers are either substituted or unsubstituted, but the substitutents are not selected to significantly decrease the solubility of the polymer in aqueous base solution. In this embodiment, the dissolution inhibitor changes from relatively insoluble to relatively soluble when exposed to the acid generated by the PAG, and, typically, heat.

If the dissolution inhibitor has acid labile substituents which masks its aqueous base solubility, the dissolution inhibitor is used in conjunction with a PAG as previously described. In this embodiment, the amount of PAG in the energy sensitive resist material is about 0.5 weight percent to about 4 weight percent and the amount of dissolution inhibitor in the energy-sensitive material is about 10 to about 40 weight percent.

In a third embodiment of the present invention, the resist materials contain the polymer that is inherently insoluble in aqueous base in combination with a dissolution inhibitor and a PAG. In this embodiment, the contrast between the portion of the resist material that is exposed to radiation and the unexposed portion is enhanced because the aqueous base solubility of both the polymer and the dissolution inhibitor is altered by the acid generated by the PAG when the resist material is exposed to radiation and subjected to a post-exposure bake.

One example of a suitable copolymer is the polymerization product of a norbornene monomer, a maleic anhydride monomer, and two acrylate monomers. The resulting polymer is represented by the following structure:

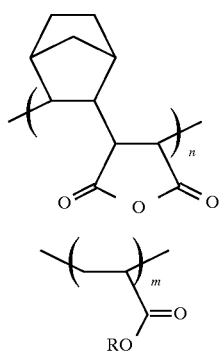

-continued

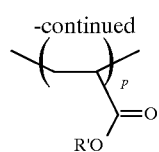

wherein n=about 0.95 to about 0.5, m+p=about 0.05 to about 0.5, and n+m+p=1. It is advantageous if n=0.85 to about 0.55 and m+p=about 0.15 to about 0.45. For the above polymer to be inherently insoluble in aqueous base, either R, R' or both are substituent groups that provide the polymer with the desired insolubility. If one or either R of R' is a substituent that provides the polymer with the desired degree of insolubility, then the other of R or R' can be hydrogen. If R is the substituent intended to render the polymer insoluble in aqueous base solution, then R is an acid labile group. If R' is the substituent intended to render the polymer insoluble in aqueous base solution, then R' is an acid labile group. In the embodiment wherein one of R and R' is an acid labile group and the other of R and R' is hydrogen, the relative amount of m and p in the polymer is selected so that the polymer has the requisite degree of insolubility in aqueous base solution and has the requisite degree of differential solubility between the exposed resist material and the non-exposed resist material. This polymer is used in the embodiments described above wherein the resist material is formed from either the relatively insoluble polymer and the PAG, or from the relatively insoluble polymer, a PAG, and a dissolution inhibitor.

An appropriate optical density in the wavelength range of the exposing radiation significantly enhances resist quality. Too low an optical density results in inefficient absorption of the exposing radiation and in unnecessarily long exposure times. Too high an optical density does not permit sufficient light to reach the regions of the polymer film furthest removed from its ambient/resist film interface. This incomplete exposure tends to degrade resist image quality. In general, it is desirable to employ an optical density that is preferably less than 0.6 for at least 30 percent of the exposing radiation to reach the substrate at the exposure wavelength.

The optical density depends on the concentration of the absorbing species in to the polymer and the PAG. Thus, once a suitable thickness for the resist material coating is chosen, the resist composition is adjusted to provide the desired optical density. For thicknesses as previously discussed in connection with film continuity, if the desired optical density is maintained, useful results are attained.

In the process of the present invention, generally, the resist material containing the resist material described generally above, is formed into a film on the surface of a substrate that is typically a silicon wafer. The silicon wafer will typically have layers of other materials formed thereon. These wafers, with or without layers of other materials formed thereon, are referred to herein as substrates.

The thickness of the coating depends upon a variety of factors such as the absorption of the resist, the quality of the film, and the effect of thickness on image resolution. Typically, the thickness of the resist is the range of about 0.2 $\mu$m to about 2 $\mu$m.

After coating, the resist is preferably prebaked to remove any remaining solvent. Pre-exposure baking temperatures in the range of 70° C. to 160° C. for times in the range of about 0.5 to about 60 minutes are desirable. The resist material is then exposed to energy such as ultraviolet radiation with a wavelength of about 190 nm to about 370 nm, x-ray radiation, or electron beam radiation. Typical doses in the range of 5 to 250 mJoules/cm$^2$ for 193 nm light are contemplated as suitable. (Corresponding doses for electron beam and x-ray irradiation are contemplated.) Conventional exposure techniques are employed to delineate the resist material.

It is then desirable to post-bake the exposed material. This post-bake enhances the reaction of, depending upon the particular embodiment, the relatively insoluble polymer or the dissolution inhibitor with the photoacid. Generally, post-bake temperatures in the range of about 70° C. to about 160° C. for time periods of about 20 seconds to about 30 minutes are effective. Heating means such as a hot plate sold by Brewer Sciences are contemplated as useful.

Solvents suitable for developing the exposed image are materials such as water/tetramethylammonium hydroxide, water/NaOH, or lower alkyl alcohol mixtures of lower alkyl alcohols such as isopropanol, ethanol and methanol with or without water. Generally, immersion in the developer for time periods from 20 seconds to 5 minutes produces the desired delineation.

After the development, the pattern in the resist is transferred into the underlying substrate using conventional etching expedients well known to one skilled in the art.

The choice of a particular dissolution inhibitor for use in the process of the present invention depends upon the wavelength of the exposing radiation and the absorption characteristics of the particular dissolution inhibitor. In processes in which the wavelength of the exposing radiation is 248 nm, napthoquinone diazide dissolution inhibitors such as those described in Reiser, A., *Photoreactive Polymers: The Science and Technology of Resists*, chapters 5 and 6 (John Wiley & Sons, pub. 1989) and Dammel, R., *Diazonapthoquinone-based Resists*, (SPIE Optical Engineering Press 1993), which are hereby incorporated by reference, are contemplated as suitable. Diazides such as napthoquinonediazide and a pentaester of a hexahydroxyspirobifluorene with napthoquinone-2-diazide-5-sulfonic acid are examples of such dissolution inhibitors. It is advantageous if the energy-sensitive resist material is about 10 to about 35 weight percent dissolution inhibitor with a molecular weight of less than about 2000.

The napthoquinone diazide dissolution inhibitors absorb radiation at 248 nm and are even more absorbent at 193 nm. In fact, these dissolution inhibitors absorb too strongly to be incorporated into resist materials for use in processes in which the wavelength of the exposing radiation is 193 nm. Consequently, dissolution inhibitors that do not contain ethylenic saturation and are predominantly composed of alicyclic moieties are advantageous in the embodiment of the present invention in which the wavelength of the exposing radiation is 193 nm. Examples of suitable dissolution inhibitors include bile acid esters derived from cholic acid, deoxycholic acid, ursocholic acid, and lithocholic acid. The use of these dissolution inhibitors in lithographic process for device fabrication is described in U.S. Pat. No. 5,310,619 to Crivello et al. and U.S. Pat. No. 5,372,912 to Allen et al., both of which are hereby incorporated by reference.

EXAMPLE 1

A copolymer of norbornene and maleic anhydride was prepared using the following procedure. Unless otherwise specified, all of the reagents specified in the examples herein were obtained from Aldrich Chemical Co. Norbornene (40.7 g; 432 mmol) was vacuum-transferred into a dry 500 mL Schlenk flask equipped with two PTFE-stoppered inlet valves and an efficient stir-bar. Freshly sublimed maleic anhydride (42.4 g; 432 mmol), 2,2'-azobisisobutyronitrile (AIBN) (0.706 g; 1 mole percent), and tetrahydrofuran (THF) (60 mL) were added under positive argon pressure. The mixture was degassed by three freeze-pump-thaw cycles, sealed, and immersed in an oil bath at 65° C. for 24 hours. Upon cooling, the mixture was precipitated into five volumes of diethyl ether and filtered to collect the polymer. The solid was redissolved in acetone (100 mL) and precipitated into five volumes of diethyl ether. This process was repeated twice more. The polymer was collected via filtration and dried and 50° C. under vacuum.

EXAMPLE 2

A copolymer of 1,5-Dimethyl-1,5-cyclooctadiene and maleic anhydride was prepared according to the following procedure. The resulting copolymer is depicted in FIG. 1. 1,5-Dimethyl-1,5-cyclooctadiene (11 g; 102 mmol) was vacuum transferred into a dry 100 mL Schlenk flask equipped with two PTFE-stoppered inlet valves and an efficient stir bar. Freshly sublimed maleic anhydride (10 g; 102 mmol), AIBN (0.164 g; 1 mole percent), and dioxane (30 mL) were added under positive argon pressure. The mixture was degassed by three freeze-pump-thaw cycles, sealed, and immersed in an oil bath at 65° C. for 24 hours. Upon cooling, dioxane was removed under vacuum. The polymer was then redissolved in methyl ethyl ketone and the mixture was precipitated into five volumes of diethyl ether and filtered to collect the polymer. The solid was redissolved in 25 mL methyl ethyl ketone and precipitated into five volumes diethyl ether. This process was repeated three times in total. The polymer was collected in the final filtration and dried at 50° C. under vacuum.

EXAMPLE 3

Figure 2:
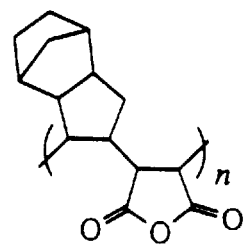
FIG. 2 illustrates a copolymer of 5,6,-Dihydrodicyclopentadiene and maleic anhydride.

A copolymer of 5,6,-Dihydrodicyclopentadiene and maleic anhydride was prepared according to the following procedure. The copolymer is depicted in FIG. 2. 5,6,-Dihydrodicyclopentadiene (10 g; 75 mmol) was vacuum-transferred into a dry 100 mL Schlenk flask equipped with two PTFE-stoppered inlet valves and an efficient stir bar. Freshly sublimed maleic anhydride (7.31g; 75 mmol), AIBN (0.122 g; 1 mole percent), and THF (17 mL) were added under positive argon pressure. The mixture was degassed by three freeze-pump-thaw cycles, sealed, and immersed in an oil bath at 65° C. for 24 hours. Upon cooling, the mixture was added into 5 volumes of diethyl ether and filtered to collect the polymer. The polymer was then redissolved in methyl ethyl ketone (25 mL) and the mixture was precipitated into five volumes of diethyl ether. This process was repeated two more times. The polymer was collected in the final filtration and dried at 50° C. under vacuum.

EXAMPLE 4

Figure 3:
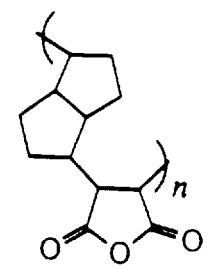
FIG. 3 illustrates a copolymer of 1,5,-Cyclooctadiene and maleic anhydride.
Figure 4:
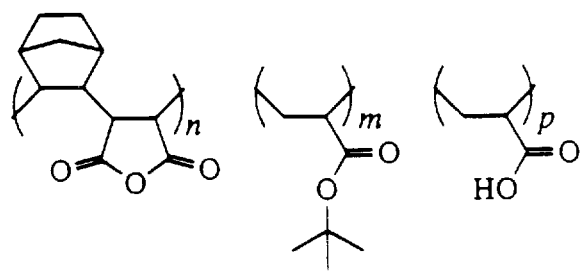
FIG. 4 illustrates a copolymer of norbornene, maleic anhydride, t-butyl acrylate, and acrylic acid.

A copolymer of 1,5,-Cyclooctadiene and maleic anhydride was prepared according to the following procedure. The copolymer is depicted in FIG. 3. 1,5,-Cyclooctadiene (11 g; 102 mmol) was vacuum-transferred into a dry 100 mL Schlenk flask equipped with two PTFE-stoppered inlet valves and an efficient stir bar. Freshly sublimed maleic anhydride (10 g; 102 mmol), AIBN (0.164 g; 1 mole percent), and dioxane (30 mL) were added under positive argon pressure. The mixture was degassed by three freeze-pump-thaw cycles, sealed, and immersed in an oil bath at 65° C. for 24 hours. Upon cooling, the dioxane was removed under vacuum, the polymer was redissolved in methyl ethyl ketone, and the mixture was precipitated into 5 volumes of diethyl ether and filtered to collect the polymer. The polymer was then redissolved in methyl ethyl ketone (25 mL) and the mixture was precipitated into five volumes of diethyl ether. This process was repeated two more times. The polymer was collected in the final filtration and dried at 50° C. under vacuum.

EXAMPLE 5

A terpolymer of norbornene, maleic anhydride and acrylic acid was synthesized according to the following procedure. Norbornene (40.34 g; 428 mmol) was vacuum-transferred into a dry 500 mL Schlenk flask equipped with two PTFE-stoppered inlet valves and an efficient stir-bar. Freshly sublimed maleic anhydride (34.63 g; 353 mmol), distilled acrylic acid (5.14 mL; 75 mmol), AIBN (0.703 g; 1 mole percent), and THF (100 mL) were added under positive argon pressure. The mixture was degassed by three freeze-pump-thaw cycles, sealed, and immersed in an oil bath at 65° C. for 24 hours. Upon cooling, the mixture was precipitated into 5 volumes of diethyl ether and filtered to collect the polymer. This process was repeated two more times. The polymer was collected in the final filtration and dried at 50° C. under vacuum.

EXAMPLE 6

Resist materials were prepared by combining the copolymer of norbornene, acrylic acid and maleic anhydride described in Example 5 with cyclohexanone. The resulting solution was about 11 to 14 weight percent polymer. A dissolution inhibitor, t-butyl lithocholate or t-butyl deoxycholate, was added to the solution in an amount that was about 25 percent by weight relative to the weight of the polymer in the resist material. A photoacid generator (PAG), triphenylsulfonium trifluoromethanesulfonate was added to the solution in an amount that was about one percent by weight percent relative to the amount of polymer in the solution. The solution was filtered using PTFE membranes with an average pore size that was less than 0.2 μm.

The solution was then spun at 2000 RPM onto HMDS-primed silicon wafers with diameters of 4 inches, 5 inches, and 6 inches. The coated wafers were baked at 120° C. for 60 seconds on a hot plate. The resist films had a thickness ranging from about 0.6 μm to about 0.9 μm. The films were then patternwise exposed to radiation at a wavelength of 248 nm using a Suss Model MA56A contact aligner equipped with a Lamda Physik excimer laser or a GCA XLS LaserStep® deep UV exposure tool. The exposure dose was varied systematically from about 0.25 to about 40 mJ/cm$^2$. The clearing dose was varied from about 3 to about 5 mJ/cm$^2$ depending upon the precise formulation.

The exposed films were then baked at 120° C. to 140° C. for one to two minutes. The patterns were then developed in an aqueous base solution (0.262N solution of tetramethylammonium hydroxide (TMAH)) for about 3 minutes. The developed resist defined features as small as 0.25 μm when the exposure dose was about twice the clearing dose. One skilled in the art will appreciate that the selection of a suitable exposure does will depend upon the particular resist material that is used, as well as other process variables.

EXAMPLE 7

A copolymer of norbornene, maleic anhydride, t-butyl acrylate and acrylic acid was synthesized according to the following procedure. Norbornene (16.41 g; 174 mmol) was vacuum-transferred into a dry 500 mL Schlenk flask equipped with two PTFE-stoppered inlet valves and an efficient stir-bar. Freshly sublimed maleic anhydride (17.09 g; 174 mmol), distilled t-butyl acrylate (4.46 g; 34.8 mmol), and distilled acrylic acid (2.51 g; 34.8 mmol), AIBN (0.286 g; 1 mole percent), and THF (40 mL) were added under positive argon pressure. The mixture was degassed by three freeze-pump-thaw cycles, sealed, and immersed in an oil bath at 65° C. for 18 hours. Upon cooling, the mixture was precipitated into 5 volumes of diethyl ether and filtered to collect the polymer. Upon cooling, the mixture was precipitated into 5 volumes of diethyl ether and filtered to collect the polymer. This process was repeated three more times. The polymer was collected in the final filtration and dried at 50° C. under vacuum.

EXAMPLE 8

Resist materials were prepared by combining the copolymer of norbornene, t-butyl acrylate, acrylic acid and maleic anhydride described in Example 7 with propylene glycol methyl ether acetate. The resulting solution was about 14 weight percent polymer. A photoacid generator (PAG), diphenyliodonium trifluoromethanesulfonate was added to the solution in an amount that was about one percent by weight percent relative to the amount of polymer in the solution. The solution was filtered using PTFE membranes with an average pore size that was less than 0.2 μm.

The solution was then spun at 2000 RPM onto HMDS-primed silicon wafers with diameters of 4 inches, and 6 inches. The coated wafers were baked at 120° C. for 60 seconds on a hot plate. The resist films had a thickness of about 0.7 μm. The films were then patternwise exposed to radiation at a wavelength of 248 nm using a Suss Model MA56A contact aligner equipped with a Lamda Physik excimer laser or a GCA LaserStep® deep UV exposure tool. The exposure dose was varied systematically from about 0.5 to about 40.5 mJ/cm$^2$. The resolution dose was determined to be about 40 mJ/cm$^2$.

The exposed films were then baked at 120° C. for two minutes. The patterns were then developed in an aqueous base solution (0.262N solution of tetramethylammonium hydroxide (TMAH)) for about 2.5 minutes. The developed resist defined features as small as 0.25 μm.

EXAMPLE 9

Resist materials were prepared by combining the copolymer of norbornene, acrylic acid, t-butyl acrylate, and maleic anhydride described in Example 7 with propylene glycol methyl ether acetate. The resulting solution was about 12.5 weight percent polymer. A dissolution inhibitor, t-butyl lithocholate or t-butyl deoxycholate, was added to the solution in an amount that was about 25 percent by weight relative to the weight of the polymer in the resist material. A photoacid generator (PAG), diphenyliodonium trifluoromethanesulfonate or diphenyliodonium nonafluorobutanesulfonate, was added to the solution in an amount that was about one percent by weight percent relative to the amount of polymer in the solution. The solution was filtered using PTFE membranes with an average pore size that was less than 0.2 μm.

The solution was then spun at 2000 RPM onto HMDS-primed silicon wafers with diameters of 4 inches and 6 inches. The coated wafers were baked at 120° C. for 60 seconds on a hot plate. The resist films had a thickness of about 0.7 μm. The films were then patternwise exposed to radiation at a wavelength of 248 nm using a Suss Model MA56A contact aligner equipped with a Lamda Physik excimer laser or a GCA LaserStep® deep UV exposure tool. The exposure dose was varied systematically from about 1 to about 81 mJ/cm². The resolution dose was found to be 40 mJ/cm² in the resist that contained trifluoromethanesulfonate PAG and 60 mJ/cm² for the resist that contained the nonafluorobutanesulfonate PAG.

The exposed films were then baked at 120° C. for two minutes. The patterns were then developed in an aqueous base solution (0.262N solution of tetramethylammonium hydroxide (TMAH) for about 2.5 minutes. The developed resist defined features as small as 0.25 μm.

One skilled in the art will appreciate that the selection of a suitable exposure does will depend upon the particular resist material that is used, as well as other process variables.

What is claimed is:

1. A process for device fabrication comprising:

forming a layer of an energy sensitive resist material on a substrate wherein the energy sensitive resist material comprises a radiation sensitive material and a polymer which is the polymerization product of monomers, wherein about 25 mole percent to about 50 mole percent of the monomers incorporated into the polymer have an alicyclic hydrocarbon moiety that is either incorporated into the polymer backbone or pendant to the polymer backbone via a saturated hydrocarbon linkage and about 25 mole percent to about 50 mole percent of the monomers incorporated into the polymer are a maleic anhydride monomer and wherein the polymer has at least one substituent that is selected from the group consisting of acid labile substituents, free acid substituents or both;

exposing the layer of energy sensitive resist material to patterned radiation selected from the group consisting of ultraviolet radiation, x-ray radiation, and electron beam radiation thereby introducing an image of the pattern into the resist material;

developing the image into a pattern; and transferring the pattern into the underlying substrate.

2. The process of claim 1 wherein the polymer is the polymerization product of the alicyclic hydrocarbon moiety-containing monomer, the maleic anhydride monomer and a third monomer that is selected from the group consisting of acrylic acids, methacrylic acids, acrylates, and methacrylates.

3. The process of claim 2 wherein the alicyclic hydrocarbon moiety-containing monomer is selected from the group consisting of norbornene, 1,5-dimethyl-1,5-cyclooctadiene, 5,6,-dihydrodicyclopentadiene, and 1,5-cyclooctadiene.

4. The process of claim 3 wherein the exposing radiation is ultraviolet radiation with a wavelength of about 193 nm.

5. The process of claim 4 wherein the third monomer is selected from the group consisting of acrylic acid and methacrylic acid and the polymer has the following structure

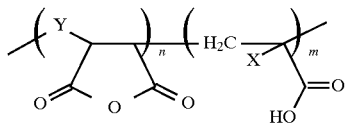

wherein Y is the alicyclic hydrocarbon moiety-containing monomer, X is either hydrogen or methyl and wherein n is about 0.95 to about 0.5, m is about 0.05 to about 0.5 and n+m is equal to one.

6. The process of claim 5 wherein the resist material further comprising a dissolution inhibitor, wherein the amount of the radiation sensitive material in the resist material is about 0.5 to about 20 weight percent of the resist material and the amount of dissolution inhibitor in the resist material is about 10 to about 40 weight percent.

7. The process of claim 4 wherein the polymer is the polymerization product of norbornene, maleic anhydride, the third monomer, and a forth monomer wherein the polymer has the following structure:

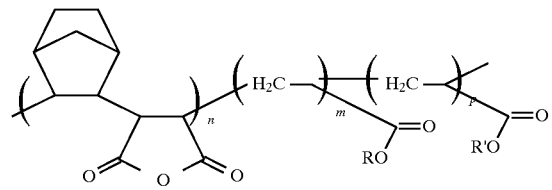

wherein n is about 0.95 to about 0.5, m+p is about 0.05 to about 0.5 and n+m+p is equal to one, wherein at least one of R and R' is an acid labile group and the other is either an acid labile group or hydrogen and the polymer is soluble in aqueous base solution.

8. The process of claim 7 wherein the resist material further comprising a dissolution inhibitor, wherein the amount of the radiation sensitive material in the resist material is about 0.5 to about 20 weight percent of the resist material and the amount of dissolution inhibitor in the resist material is about 10 to about 40 weight percent.

9. The process of claim 4 wherein the third monomer is selected from the group consisting of acrylates and methacrylates and the polymer has the following structure:

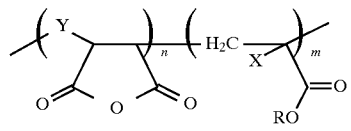

or

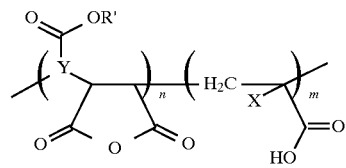

wherein Y is the alicyclic hydrocarbon moiety-containing monomer, and wherein n is about 0.95 to about 0.5, m is about 0.05 to about 0.5 and n+m is equal to one, wherein R and R' are either acid labile groups or hydrogen and wherein at least one of R and R' is an acid labile group wherein the amount of the acid labile groups on the polymer is sufficient to render the polymer insoluble in aqueous base solution.

10. The process of claim 9 wherein the acid labile groups are selected from the group consisting of t-butyl, t-amyl, 1-methoxycyclohexyl, 3-oxocyclohexyl, and bis(2-trimethylsilyl)ethyl.

11. The process of claim 9 wherein the resist material further comprises a dissolution inhibitor, wherein the amount of the photoacid generator in the resist material is about 0.5 to about 20 weight percent the resist material and the amount of dissolution inhibitor in the resist material is about 10 to about 40 weight percent.

12. The process of claim 9 wherein n is about 0.85 to about 0.8 and m is about 0.15 to about 0.2.

13. The process of claim 4 wherein the polymer is the polymerization product of norbornene, maleic anhydride, the third monomer, and a forth monomer, wherein the third monomer is selected from the group consisting of acrylates and methacrylates and the polymer has the following structure

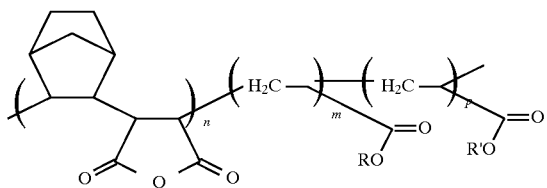

wherein X is either hydrogen or methyl and wherein n is about 0.95 to about 0.5, m+p is about 0.05 to about 0.5 and n+m+p is equal to one, wherein R and R' are either acid labile groups or hydrogen and wherein at least one of R and R' is an acid labile group wherein the amount of the acid labile groups on the polymer is sufficient to render the polymer insoluble in aqueous base solution.

14. The process of claim 13 wherein the acid labile groups are selected from the group consisting of t-butyl, t-amyl, 1-methoxycyclohexyl, 3-oxocyclohexyl, and bis(2-trimethylsilyl)ethyl.

15. The process of claim 14 wherein the resist material further comprises a dissolution inhibitor, wherein the amount of the photoacid generator in the resist material is about 0.5 to about 20 weight percent the resist material and the amount of dissolution inhibitor in the resist material is about 10 to about 40 weight percent.

16. The process of claim 15 wherein n is about 0.85 to about 0.55 and m+p is about 0.15 to about 0.45.

17. The process of claim 1 wherein the alicyclic hydrocarbon moiety-containing monomer has substituent groups pendant thereto selected from the group consisting of alkyl groups, carbonyl groups, carboxylate groups and nitrile groups and wherein the substituent groups do not significantly absorb the exposing radiation.

18. The process of claim 17 wherein the alicyclic moiety-containing monomer has carboxylate groups pendant thereto and the amount of carboxylate groups pendant to the polymer is sufficient to render the polymer insoluble in aqueous base solution.

* * * * *